United States Patent [19]

Hattori

[11] Patent Number: 4,926,432
[45] Date of Patent: May 15, 1990

[54] SEMICONDUCTOR LASER DEVICE

[75] Inventor: Ryo Hattori, Itami, Japan

[73] Assignee: Mitsubishi Denki Kabushiki Kaisha, Japan

[21] Appl. No.: 394,059

[22] Filed: Aug. 14, 1989

[30] Foreign Application Priority Data

Aug. 18, 1988 [JP] Japan .................................. 63-205575

[51] Int. Cl.$^5$ .............................................. H01S 3/19
[52] U.S. Cl. ....................................... 372/46; 372/45; 372/48; 357/16; 357/17
[58] Field of Search .................... 372/45, 46, 48, 44, 372/43; 357/16, 17

[56] References Cited

FOREIGN PATENT DOCUMENTS

| 0167488 | 8/1985 | Japan | 372/48 |
| 0042591 | 2/1987 | Japan | 372/43 |
| 0076691 | 4/1987 | Japan | 372/43 |

OTHER PUBLICATIONS

"High Power CW . . . Laser Diodes", Electronics Letters, vol. 23, No. 13, pp. 672-673, Jun. 18, 1987.

Primary Examiner—William L. Sikes
Assistant Examiner—Georgia Y. Epps
Attorney, Agent, or Firm—Leydig, Voit & Mayer

[57] ABSTRACT

A semiconductor laser device having a double heterojunction structure disposed on a current blocking layer which is disposed on a convex ridge includes a buffer layer having a conductivity-type opposite that of the current blocking layer disposed between the current blocking layer and the double heterojunction structure. A current injection groove in the ridge penetrates the current blocking and buffer layers so that the lower cladding layer of the double heterojunction structure contacts the ridge. Therefore, a thin active layer may be produced using the liquid phase epitaxy ridge effect. The pn junction between the current blocking layer and the lower cladding layer is stabilized by the intervening buffer layer.

4 Claims, 3 Drawing Sheets

FIG 4(b')

SEMICONDUCTOR LASER DEVICE

FIELD OF THE INVENTION

The present invention relates to a semiconductor laser device and, more particularly, to a laser capable of a high power output.

BACKGROUND OF THE INVENTION

FIG. 3 shows a prior art semiconductor laser device having a double-hetero structure and a current blocking layer having a stripe ridge. In FIG. 3, reference numeral 1 designates a p type GaAs substrate. N type GaAs current blocking layer 2 is disposed on p type GaAs substrate 1. Lower cladding layer 3 comprising p type $Al_{0.48}Ga_{0.52}As$ is disposed on current blocking layer 2. P type $Al_{0.15}Ga_{0.85}As$ active layer 4 is disposed on lower cladding layer 3. N type $Al_{0.48}Ga_{0.52}As$ upper cladding layer 5 is disposed on active layer 4. N type GaAs contact layer 6 is disposed on upper cladding layer 6. A current injection groove 7 portion 7 of cladding layer penetrates a stripe ridge formed by GaAs substrate 1 and current blocking layer 2. Reference numeral 8 designates the stripe ridge portion. P side electrode 10 and n side electrode 11 are disposed on p type GaAs substrate 1 and n type contact layer 6, respectively. The crystal growth of the stripe ridge 8 is achieved by liquid phase epitaxy (hereinafter referred to as "LPE"). The crystal growth speed greatly depends on the crystal-lographic orientation of the crystal surface. That is, the crystal growth speed at the side surface of ridge is faster than at top flat portion. The rate of growth on the top of the ridge is suppressed by the fast growth at the ridge side surface. As a result, the thickness of the active layer 4 can be reproducibly made less than 0.05 micron.

The light generated at active layer 4 spreads out to the lower and upper cladding layers 3 and 5. That light has a certain distribution area determined by the light propagation characteristics of the laser cavity, the parameter of principal importance being the thickness of active layer.

When the thickness of active layer 4 becomes as thin as 0.05 microns, the area of light distribution is broadened without the increase of threshold current. In other words, too thin an active layer causes the extreme increase in the threshold current. Therefore, that thickness should not to be much thinner than about 0.05 microns. Therefore, because the peak intensity of the light distribution is reduced as the distribution area of light spreads out at a predetermined light output, the light output level at which the catastrophic optical damage (hereinafter referred to as "COD") increases the facet as the active layer 4 becomes thinner. That is, the enhanced light output power is realized by the thinning of the active layer 4, and the thickness of the active layer 4 can be reliably controlled in the stripe ridge configuration.

However, the ridge configuration affects not only the active layer 4 but also the lower cladding layer 3. As a result, the thickness of the lower cladding layer 3 at the top portion of the ridge is made thin so that the thickness of the lower cladding layer 3 may be made too thin. Furthermore, when growing the p type lower cladding layer 3 on the n type current blocking layer 2, some melt used back of the current blocking layer 2 into the melt for growing the lower cladding layer 3 occurs at the top portion of the ridge. As a result the carrier concentration of the cladding layer 3 is reduced compared to the situation in which those layers are grown in totally planar regions. Thus, the pn junction between the current blocking layer 2 and the lower cladding layer 3 may not be perfectly produced. In such case the leakage current flowing directly from the current blocking layer 2 on the ridge to the upper cladding layer 5 is increased, and the threshold current and the operation current of laser oscillation are increased. These current increases reduce the yield in the production of these semiconductor laser devices.

SUMMARY OF THE INVENTION

It is an object of the present invention to provide a semiconductor laser device utilizing the the stripe ridge configuration of the prior art device and preventing current leakage thereby to make the laser operation stable.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor laser device of the present invention, a semiconductor layer having a conductivity type opposite to that of the current blocking layer is produced at a portion other than the current injection groove between the current blocking layer and the lower cladding layer as a buffer layer. Thus, the thinning of the active layer due to ridge effect is sufficiently utilized and the pn junction between the current blocking layer and the lower cladding layer is stabilized by the buffer layer.

DETAILED DESCRIPTION OF THE PREFERRED EMBODIMENTS

An embodiment of the present invention will be described in detail with reference to the drawings.

Figure 1:
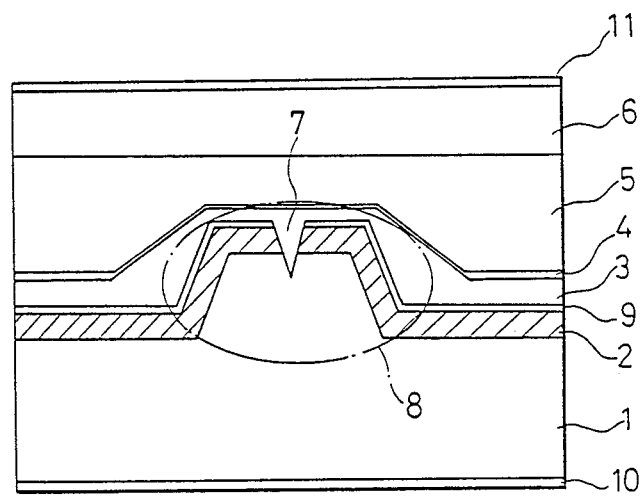
FIG. 1 is a cross-sectional view showing a semiconductor laser device according to an embodiment of the present invention.
Figure 3:
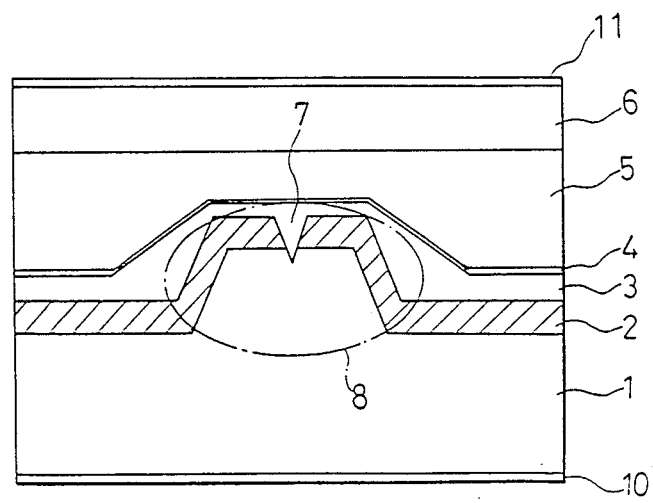
FIG. 3 is a cross-sectional view showing a prior art semiconductor laser device.

FIG. 1 shows a semiconductor laser device according to an embodiment of the present invention. In FIG. 1, the same reference numerals designate the same or corresponding elements as those shown in FIG. 3. Reference numeral 9 designates a p type GaAs buffer layer 9 disposed between the current blocking layer 2 and the lower cladding layer 3.

The production process will be described with reference to FIGS. 2(c) to 2(d) which shows the steps in a process for making the semiconductor laser of FIG. 1.

Figure 2A:
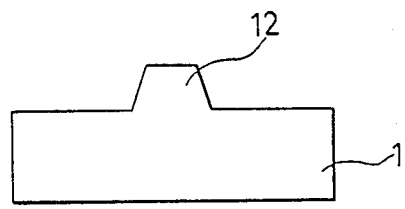
FIGS. 2(a) to 2(d) are cross-sectional views showing the steps in a method of making the semiconductor laser device of FIG. 1.
Figure 2B:
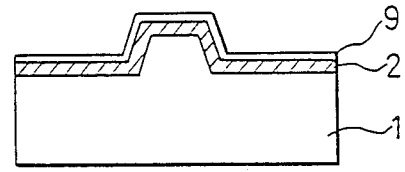
Figure 2C:
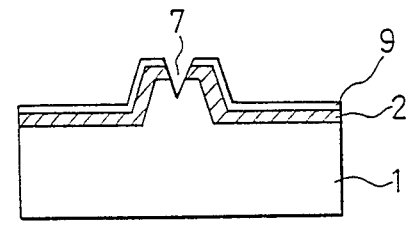
Figure 2D:
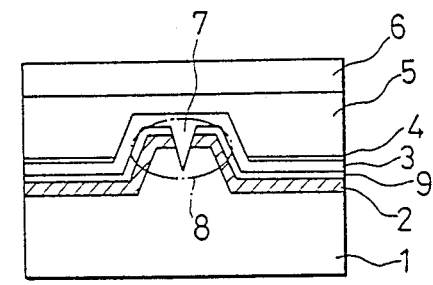

A stripe ridge 12 is produced on the semiconductor substrate 1 as shown in FIG. 2(a), and thereafter, a current blocking layer 2 and a buffer layer 9 are grown for example, by a metal organic chemical vapor deposition (MOCVD) method as shown in FIG. 2(b). Thereafter, a current injection groove 7 is produced as shown in FIG. 2(c) and a lower cladding layer 3, an active layer 4, an upper cladding layer 5 and a contact layer 6 are successively grown by LPE as shown in FIG. 2(d), thereby producing a double-hetero structure.

Another production process will be described with reference to FIGS. 4(a) to 4(d) that is similar the process described in FIG. 2.

Figure 4A:
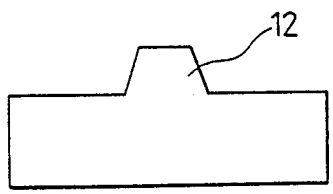
FIGS. 4(a) to 4(d) are cross-sectional views showing a semiconductor laser device and the steps in a method of making the laser according to another embodiment of the present invention.
Figure 4B:
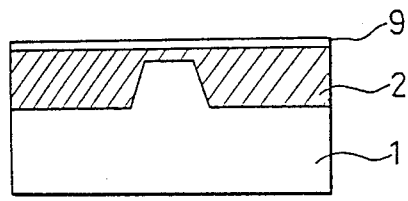
Figure 4C:
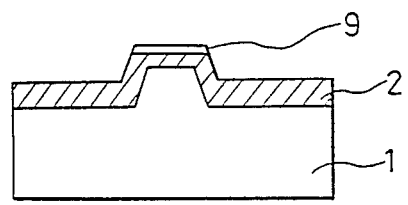
Figure 4C:
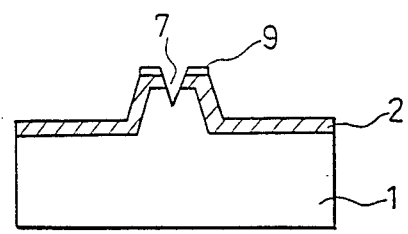
Figure 4D:
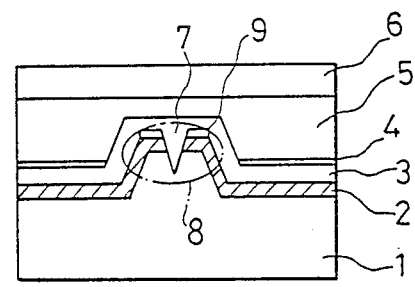

Therein, a current blocking layer 2 and a buffer layer 9 are grown by, for example, an LPE method as shown in FIG. 4(b). Thereafter, the ridge is formed by masking and etching as shown in FIG. 4(b'). At that time, the buffer layer 9 is left only on top of the ridge portion. Therefore, the role of the buffer layer 9 can be achieved. The subsequent processes shown in FIGS. 4(c) and 4(d) are similar to those of FIGS. 2(c) and 2(d) thereby producing the a laser device shown in FIG. 4(d).

When the p type GaAs buffer layer 9 is not provided through the processes, such as those in FIGS. 2(a) to 2(d), the liquid phase melt for the growth of the lower cladding layer 3 is in contact with the current blocking layer 2 during the growth of the lower cladding layer 3. Then, especially at the top portion of the ridge, the growth speed is retarded by the fast growth speed at the ridge side surface as described above. In other words, the degree of super-saturation of the liquid phase melt at the top portion of the ridge is locally lowered with relative to the other regions. Therefore, remelting of the n type current blocking layer 2, that is, so-called melt back, occurs, to some degree, due to the growth melt of the p type lower cladding layer 3 (hereinafter referred to as "lower clad melt") and the ridge configuration is slightly changed. Then, the melt back component of the n type current blocking layer 2 is melted into the p type lower cladding melt in growing the p type lower cladding layer 3, and the p type carrier concentration of the lower cladding layer 3 is reduced thereby. Therefore, especially at the top portion of ridge, the pn junction produced between the current blocking layer 2 and the lower cladding layer 3 may be incomplete, increasing leaking current and lowering the yield. Further, when the lower cladding layer 3 is too thin, its pn junction with the current blocking layer 2 may also be incomplete, whereby the current blocking layer 2 and the upper cladding layer 5 are electrically connected and current leakage is increased.

When p type GaAs buffer layer 9 is disposed between the n type current blocking layer 2 and the p type lower cladding layer 3 as in the present invention, the lower cladding melt is in contact with this p type buffer layer 9. Therefore, even when the buffer layer 9 is melted back by the lower cladding melt, the p type carrier concentration of the lower cladding layer 3 is not lowered because the buffer layer 9 is of p type and a stable pn junction is produced between the lower cladding layer 3 and the current blocking layer 2.

Furthermore, even when the lower cladding layer is too thin, because a pn junction exists between the current blocking layer 2 and the buffer layer 9, a current from the current blocking layer 2 to the upper cladding layer 5 is not likely to flow. In addition, the thickness of the active layer 4 can be stably controlled in thickness by the ridge differential growth effect as in the prior art.

Furthermore, in this embodiment the buffer layer comprises not AlGaAs but GaAs which is not likely to be oxidized. Therefore, even if the buffer layer 9 is exposed to air while producing current injection groove 7, the regrowth surface remains in good condition, thereby enhancing the devices reliability.

As is evident from the foregoing description, according to the present invention, a semiconductor layer having a conductivity type opposite that of the current blocking layer is produced as a buffer layer other than the current injection groove between the current blocking layer having a ridge configuration and the lower cladding layer of the double-hetero structure. Therefore, a semiconductor laser having a thin active layer can be produced stably without increasing current leakage, and thus, production yield can be enhanced.

What is claimed is:

1. A semiconductor laser device comprising:
   a first electrode;
   a semiconductor substrate of a first conductivity-type disposed on said first electrode and having a ridge opposite the first electrode;
   a semiconductor current blocking layer of a second conductivity-type opposite the first conductivity-type disposed on said semiconductor substrate over said ridge;
   a semiconductor buffer layer of the first conductivity-type disposed on said current blocking layer;
   a current injection groove in said ridge penetrating said buffer and current blocking layers to said substrate; and
   a double heterojunction structure disposed on said buffer layer including a first semiconductor cladding layer of the first conductivity-type disposed on said buffer layer and in the groove, a semiconductor active layer disposed on said first cladding layer, a second semiconductor cladding layer of the second conductivity-type disposed on said active layer, and a second electrode disposed on said second cladding layer.

2. A semiconductor laser device as defined in claim 1 wherein said current blocking layer and buffer layer are produced by an MOCVD method, and said double heterojunction structure is produced by liquid phase epitaxy.

3. A semiconductor laser device as defined in claim 1 wherein said semiconductor substrate comprises GaAs and said double heterojunction structure comprises AlGaAs and GaAs.

4. A semiconductor laser device as defined in claim 3 wherein said buffer layer comprises GaAs.

* * * * *